United States Patent
Gunji (10) Patent No.: US 12,369,465 B2
(45) Date of Patent: Jul. 22, 2025

(54) DISPLAY DEVICE

(71) Applicant: Japan Display Inc., Tokyo (JP)

(72) Inventor: Masakazu Gunji, Tokyo (JP)

(73) Assignee: Japan Display Inc., Tokyo (JP)

( * ) Notice: Subject to any disclaimer, the term of this patent is extended or adjusted under 35 U.S.C. 154(b) by 673 days.

(21) Appl. No.: 17/712,518

(22) Filed: Apr. 4, 2022

(65) Prior Publication Data

US 2022/0320254 A1    Oct. 6, 2022

(30) Foreign Application Priority Data

Apr. 6, 2021    (JP) .................................. 2021-064807

(51) Int. Cl.
*H10K 59/131*    (2023.01)
*H10K 59/124*    (2023.01)

(52) U.S. Cl.
CPC ......... *H10K 59/131* (2023.02); *H10K 59/124* (2023.02)

(58) Field of Classification Search
CPC .. H10K 59/122; H10K 59/123; H10K 59/124; H10K 59/131; H10K 50/824; H10K 59/80522; H10K 50/818; H10K 50/828; H10K 59/35; H05B 33/06; H05B 33/26; G09G 2300/0426
See application file for complete search history.

(56) References Cited

U.S. PATENT DOCUMENTS

| | | | | |
|---|---|---|---|---|
| 7,095,172 B2* | 8/2006 | Sakamoto | ............ | H10K 59/173 |
| | | | | 313/506 |
| 8,610,344 B2* | 12/2013 | Matsuda | ................ | H10H 20/83 |
| | | | | 313/506 |
| 2004/0160170 A1 | 8/2004 | Sato et al. | | |
| 2005/0127825 A1* | 6/2005 | Bae | ...................... | H10K 59/122 |
| | | | | 428/917 |
| 2008/0286445 A1* | 11/2008 | Suzuki | ................. | H10K 85/626 |
| | | | | 252/301.16 |
| 2009/0009069 A1 | 1/2009 | Takata | | |
| 2012/0161167 A1* | 6/2012 | Yamazaki | .............. | H10K 59/86 |
| | | | | 438/34 |

(Continued)

FOREIGN PATENT DOCUMENTS

| | | | |
|---|---|---|---|
| JP | 2000-195677 A | 7/2000 | |
| JP | 2004-207217 A | 7/2004 | |

(Continued)

*Primary Examiner* — Mark W Tornow
*Assistant Examiner* — Priya M Rampersaud
(74) *Attorney, Agent, or Firm* — Maier & Maier, PLLC (57) ABSTRACT

According to one embodiment, a display device includes a first lower electrode and a second lower electrode disposed on a first insulating layer, a partition wall connected to a pixel circuit, a first organic layer disposed on the first lower electrode and a first upper electrode disposed on the first organic layer. The partition wall includes a conductive layer and a second insulating layer. The conductive layer is a portion connected to the pixel circuit, and includes a first side surface opposing the first lower electrode and a second side surface opposing the second lower electrode. The second insulating layer is disposed on the conductive layer. The first lower electrode is in contact with the first side surface and the second lower electrode is spaced apart from the second side surface.

19 Claims, 7 Drawing Sheets

(56) References Cited

U.S. PATENT DOCUMENTS

2021/0091158 A1   3/2021   Kasahara

FOREIGN PATENT DOCUMENTS

| JP | 2008-135325 A | 6/2008 |
| JP | 2009-032673 A | 2/2009 |
| JP | 2010-118191 A | 5/2010 |
| WO | WO 2019/026511 A1 | 2/2019 |

* cited by examiner

DISPLAY DEVICE

CROSS-REFERENCE TO RELATED APPLICATIONS

This application is based upon and claims the benefit of priority from Japanese Patent Application No. 2021-064807, filed Apr. 6, 2021, the entire contents of which are incorporated herein by reference.

FIELD

Embodiments described herein relate generally to a display device.

BACKGROUND

In recent years, display devices in which an organic light-emitting diode (OLED) is applied as a display element have been used in practical applications. Such display devices comprise an organic layer between the pixel electrode and the common electrode. The organic layer includes functional layers such as a hole transport layer and an electron transport layer in addition to the light-emitting layer. Such organic layers are formed, for example, by the vacuum deposition method.

For example, in the case of mask deposition, a fine mask with openings corresponding to pixels, respectively, is applied. Here, due to the processing accuracy of the fine mask, deformation of the shape of openings and the like, the accuracy of formation of thin films formed by the evaporation may be deteriorated. For example, an end surface of an organic layer may not be formed at a desired position, which may cause degrading of the performance of the display device. Under these circumstances, there is a demand of forming an organic layer into a desired shape without applying a fine mask.

DETAILED DESCRIPTION

In general, according to one embodiment, a display device comprises a base, a pixel circuit disposed on the base, a first insulating layer which covers the base and the pixel circuit, a first lower electrode and a second lower electrode disposed on the first insulating layer, a partition wall disposed between the first lower electrode and the second lower electrode on the first insulating layer and connected to the pixel circuit via an opening formed in the first insulating layer, a first organic layer disposed on the first lower electrode and a first upper electrode disposed on the first organic layer, and the partition wall includes a conductive layer which is a portion disposed on the first insulating layer and connected to the pixel circuit via the opening, and includes a first side surface opposing the first lower electrode and a second side surface opposing the second lower electrode, and a second insulating layer disposed on the conductive layer, and the first lower electrode is in contact with the first side surface and the second lower electrode is spaced apart from the second side surface.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and a plane defined by the X axis and the Z axis is referred to as an X-Z plane. Further, viewing towards the X-Y plane is referred to as planar view.

In some of the embodiments, a display device DSP is an organic electroluminescent display comprising an organic light-emitting diode (OLED) as the display element, which can be installed, for example, in television sets, personal computers, mobile terminals, cell phones and the like. Note that the display elements described below can be applied as a light-emitting element in an illumination device, and the display device DSP can be diverted to other electronic devices such as illumination devices.

Figure 1:
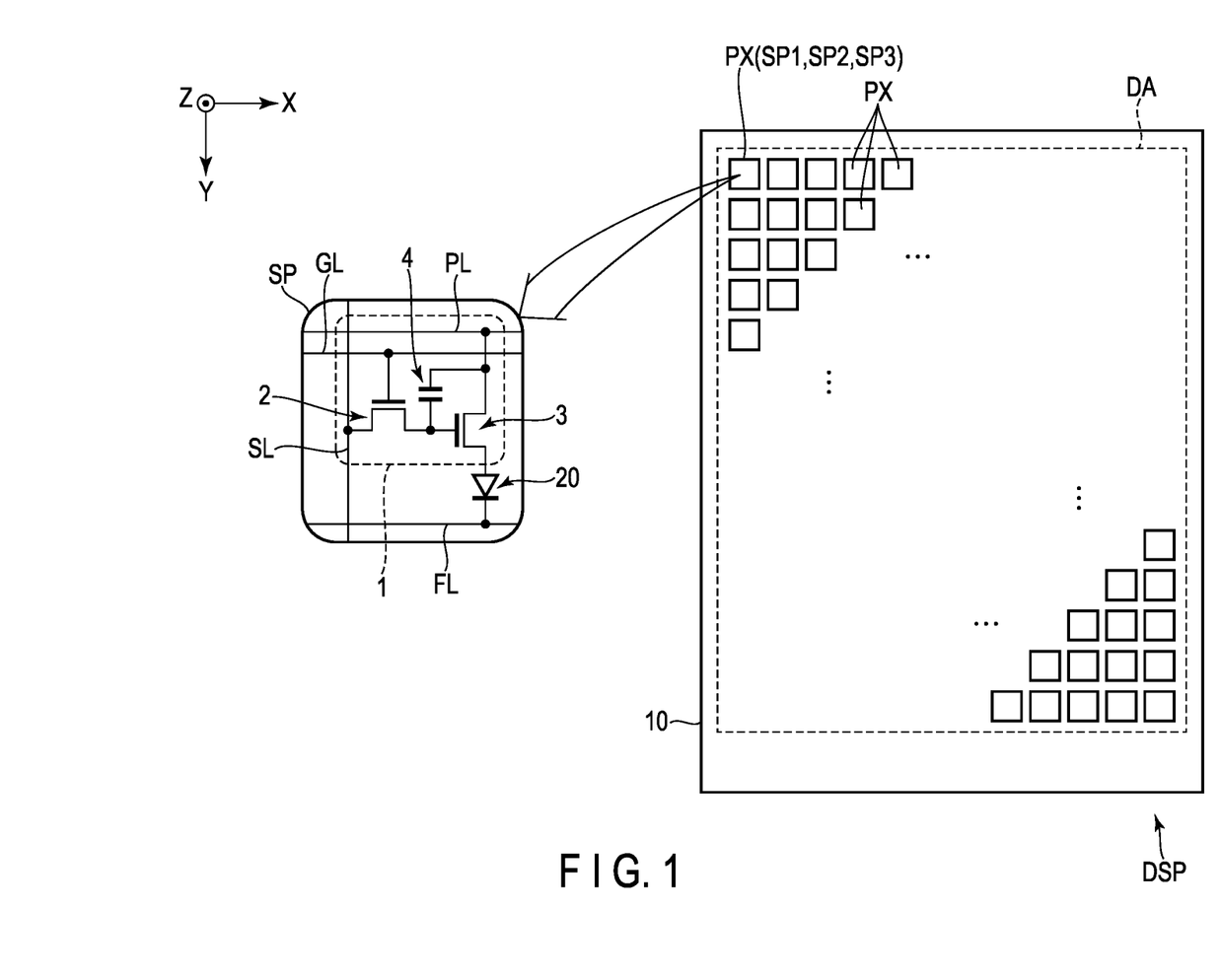
FIG. 1 is a diagram showing a configuration example of a display device according to an embodiment.

FIG. 1 is a diagram showing a configuration example of the display device DSP according to this embodiment. The display device DSP comprises a display unit DA that displays images, on an insulating base 10. The base 10 may be glass or a flexible resin film.

The display unit DA comprises a plurality of pixels PX arranged in a matrix along the first direction X and the second direction Y. The pixels PX each comprises a plurality of subpixels SP1, SP2 and SP3. For example, the pixel PX comprises a red subpixel SP1, a green subpixel SP2 and a blue subpixel SP3. Note that besides the three-color subpixels mentioned above, the pixel PX may comprise four or more subpixels of other colors such as white and the like.

A configuration example of one subpixel SP contained in the pixel PX will now be briefly described.

The subpixel SP comprises a pixel circuit 1 and a display element 20 that is driven and controlled by the pixel circuit 1. The pixel circuit 1 comprises a pixel switch 2, a drive transistor 3 and a capacitor 4. The pixel switch 2 and the drive transistor 3 are switch elements formed from thin-film transistors (TFTs), for example.

In the pixel switch 2, the gate electrode is connected to a scanning line GL, the source electrode is connected to a signal line SL, and the drain electrode is connected to one of the electrodes which constitute the capacitor 4 and the gate electrode of the drive transistor 3. In the drive transistor 3, the source electrode is connected to the other electrode which constitutes the capacitor 4 and the power line PL, and the drain electrode is connected to the anode of the display element 20. The cathode of the display element 20 is connected to the power supply line FL. Note that the configuration of the pixel circuit 1 is not limited to that of the example illustrated.

The display element 20 is an organic light-emitting diode (OLED), which is a light-emitting element. For example, the subpixel SP1 comprises a display element that emits light corresponding to a wavelength of a red color, the subpixel SP2 comprises a display element that emits light corresponding to a wavelength of a green color, and the subpixel SP3 comprises a display element that emits light corresponding to a wavelength of a blue color. With multiple subpixels SP1, SP2, and SP3 with different display colors provided in the pixel PX, it is possible to realize multiple color display.

Note, however, the display elements 20 of the subpixels SP1, SP2 and SP3 may be configured to emit light of the same color. In this way, monochromatic display can be realized.

Further, when the display elements 20 of the subpixels SP1, SP2 and SP3 are configured to emit white light, a respective color filter may be placed to oppose each display element 20. For example, the subpixel SP1 comprises a red color filter opposing the display element 20, the subpixel SP2 comprises a green color filter opposing the display element 20, and the subpixel SP3 comprises a blue color filter opposing the display element 20. With this configuration, it is possible to realize multi-color display.

When the display elements 20 of the subpixels SP1, SP2 and SP3 are configured to emit ultraviolet light, a photoconversion layer should be disposed to oppose the display element 20, and thus multi-color display can be realized.

The detailed configuration of the display element 20 will be described later.

Figure 2:
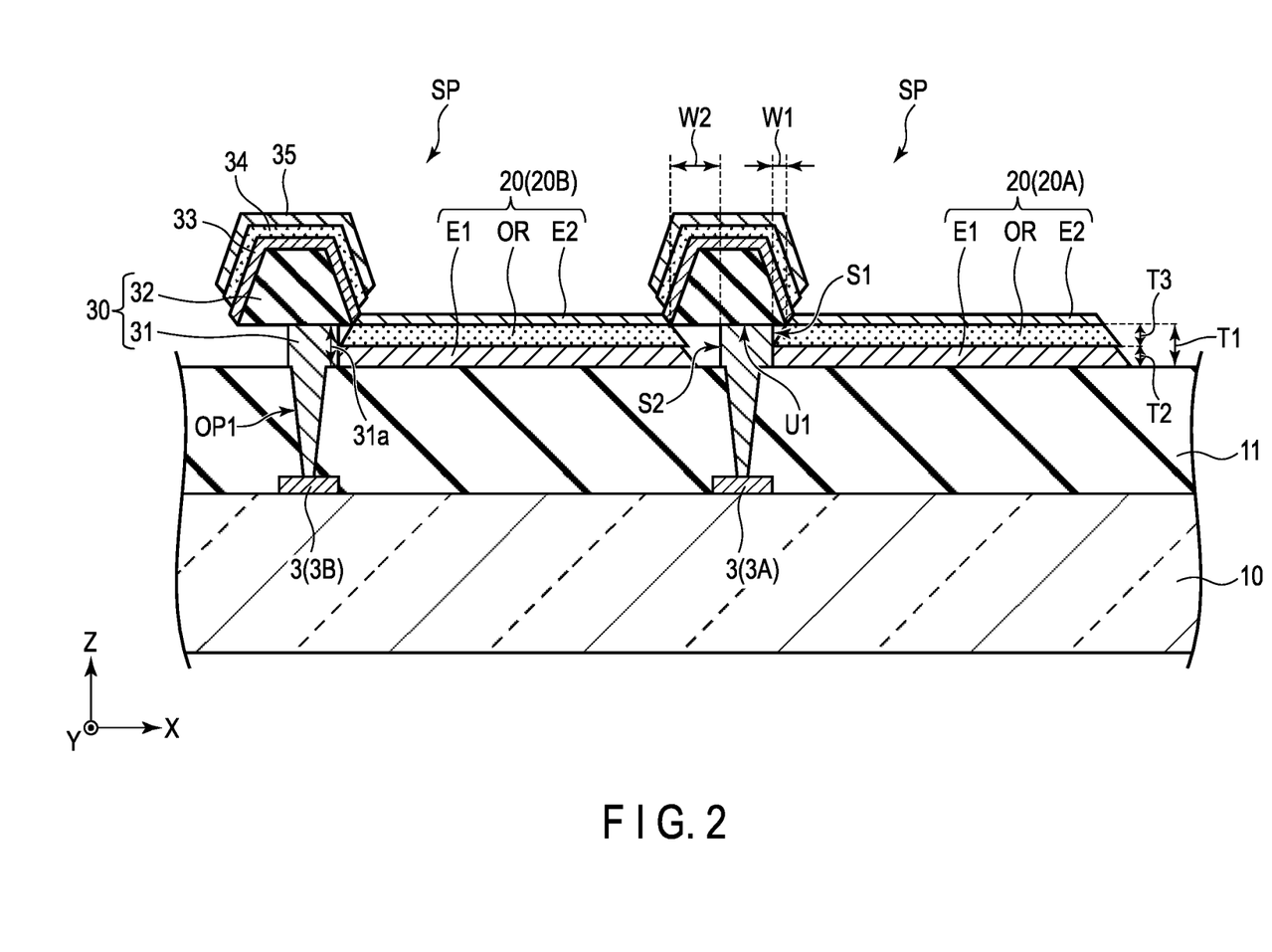
FIG. 2 is a cross-sectional view of a configuration example of subpixels shown in FIG. 1.

FIG. 2 is a cross-sectional view showing an example of the display elements 20 contained the subpixels SP shown in FIG. 1.

The pixel circuit 1 shown in FIG. 1 is placed on the base 10 and covered by an insulating layer 11 (a first insulating layer). FIG. 2 shows only the drive transistor 32 contained in the pixel circuit 1 in a simplified form. The insulating layer 11 is equivalent to an underlying base layer of the display element 20, and is made of, for example, an insulating material such as polyimide, acrylic resin, silicon nitride, silicon nitride (SiN), silicon oxide (SiO) or the like.

Openings OP1 are formed in the insulating layer 11. The openings OP1 are formed in areas overlapping the drive transistors 3, respectively, and are through holes that penetrate to the drive transistor 3. In each opening OP1, a partition wall 30 constituted by a columnar conductor 31 and an insulating eave 32 is provided. In the following descriptions, the columnar conductor 31 may be referred to simply as a conductive layer and the insulating eaves 32 may be referred to simply as an insulating layer.

The display element 20 comprises a lower electrode E1, an organic layer OR and an upper electrode E2. The organic layer OR is disposed to be sandwiched between the lower electrode E1 and the upper electrode E2.

The lower electrode E1 is an electrode provided for each subpixel or each display element, and is electrically connected to the drive transistor 3. The lower electrode E1 with such a configuration may be, in some cases, referred to as a pixel electrode, reflective electrode, anode or the like.

The upper electrode E2 is an electrode provided over a plurality of subpixels or a plurality of pixels PX, and is electrically connected to the power supply line FL. The lower electrode E2 with such a configuration may be, in some cases, referred to as a common electrode, a counter electrode, a cathode or the like.

The lower electrode E1 is placed on the insulating layer 11 and is connected to the conductive layer 31, a peripheral portion thereof of which constitutes the partition wall 30. The lower electrode E1 is electrically connected to the drive transistor 3 via the conductor layer 31.

The lower electrode E1 is a transparent electrode formed of, for example, a transparent conductive material such as indium tin oxide (ITO), indium zinc oxide (IZO) or the like. The lower electrode E1 may be a metal electrode formed of a metallic material such as silver (Ag), aluminum (Al), titanium (Ti), molybdenum (Mo), tungsten (W) or the like. The lower electrode E1 may also be of a stacked structure of a transparent electrode and a metal electrode. For example, the lower electrode E1 may be configured as a stacked body consisting of a transparent electrode, a metal electrode and a transparent electrode stacked in this order, or may be configured as a stacked body consisting of three or more layers.

The organic layer OR is disposed on the lower electrode E1. The organic layer OR includes a light-emitting layer that emits light in one of the colors red, green, or blue. The organic layer OR may include, in addition to the light-emitting layer, functional layers such as a hole injection layer, a hole transport layer, an electron blocking layer, a hole blocking layer, an electron transport layer, an electron injection layer, and the like. For this reason, the organic layer OR may be of a stacked body in which a plurality of layers including at least one of the functional layers listed above are stacked, in addition to the light-emitting layer, though FIG. 2 illustrates the organic layer OR as a single layer.

The upper electrode E2 is disposed on the organic layer OR. The upper electrode E2 is a common layer commonly used over a plurality of subpixels or a plurality of display elements. The upper electrode E2 is a transparent electrode formed of, for example, a transparent conductive material such as ITO or IZO. Note that the upper electrode E2 may be a semi-transparent metal electrode formed of a metal material such as magnesium (Mg), silver (Ag), aluminum (A) or the like. The upper electrode E2 is electrically connected to power supply lines FL disposed in the display area DA, or power supply lines FL placed outside the display section DA.

When the potential of the lower electrode E1 is relatively higher than that of the upper electrode E2, the lower electrode E1 is equivalent to the anode and the upper electrode E2 is equivalent to the cathode. Or, when the potential of the upper electrode E2 is relatively higher than that of the lower electrode E1, the upper electrode E2 is equivalent to the anode and the lower electrode E1 is equivalent to the cathode.

This embodiment is based on an assumption of an example case where the lower electrode E1 is equivalent to the anode and the upper electrode E2 is equivalent to the cathode.

Here, two adjacent display elements 20A and 20B will be focused. In the following descriptions, for the sake of convenience, elements related to the display element 20A are indicated by "A" at the end of the reference symbol, and elements related to the display element 20B are indicated by "B" at the end of the reference symbol.

The partition wall 30 is located between the display element 20A and the display element 20B. The partition wall 30 includes a conductive layer 31 and an insulating layer 32 (a second insulating layer).

The conductive layer 31 is located between a lower electrode E1A (a first lower electrode) and a lower electrode E1B (a second lower electrode), and between an organic layer ORA (a first organic layer) and an organic layer ORB (a second organic layer). The conductive layer 31 is connected to a drive transistor 3A via an opening OP1A formed in the insulating layer 11. The conductive layer 31 includes a protruding portion 31a that extends from the surface of the insulating layer 11 along the third direction Z and has a thickness T1. The protruding portion 31a includes a first side surface S1 opposing the display element 20A, a second side surface S2 opposing the display element 20B and an upper surface U1 between the first side surface S1 and the second side surface S2.

The conductive layer 31 is connected to the lower electrode E1A of one display element 20A of the two adjacent display elements 20A and 20B, and to the lower electrode E1B of the other display element 20B. In more detail, the protruding portion 31a of the conductive layer 31 is in contact with the lower electrode E1A of the display element 20A opposing the first side surface S1 in the first side surface S1, and is apart from the lower electrode E1B of the display element 20B opposing the second side surface S2 in the second side surface S2. In other words, only the lower electrode E1A of the display element 20A is electrically connected to the drive transistor 3A via the conductive layer 31.

The conductive layer 31 should preferably formed such that the thickness T1 of the protruding portion 31a is less than a total of the thickness T2 of the lower electrode E1A of the display element 20A, which is in contact with the lower electrode E1A in the first side surface S1, and the thickness T3 of the organic layer ORA disposed on the lower electrode E1A. FIG. 2 illustrates the case where the conductive layer 31 is formed such that the thickness T1 of the protruding portion 31a is equal to the total of the thickness T2 of the lower electrode E1A and the thickness T3 of the organic layer ORA. In practice, the thickness T1 of the protruding portion 31a is, for example, about 600 nm.

Note that the thickness T1 of the protruding portion 31a may be adjusted according to the emitted color. For example, when the emitted color is one of red, green, or blue (that is, when the organic layer is painted in different colors), the conductive layer 31 may be formed such that the thickness T1 of the protruding portion 31a is adjusted to be less, or when the emitted color is white (that is, when the organic layer of a tandem structure is mounted), the thickness of the protrusion 31a is thicker than that of the case where the painting in different colors is applied as described above.

The conductive layer 31 is formed of a metal material such as silver (Ag), aluminum (Al), titanium (Ti), molybdenum (Mo), tungsten (W) or the like.

The insulating layer 32 is disposed on the upper surface U1 of the protruding portion 31a of the conductive layer 31. The insulating layer 32 protrudes from the first side surface S1 mentioned above towards the display element 20A, and further extends from the second side surface S2 toward the display element 20B. The width W1 of the first portion protruding from the first side surface S1 toward the display element 20A is less than the width W2 of the second portion protruding from the second side surface S2 toward the display element 20B. That is, the insulating layer 32 has an asymmetrical shape with respect to the conductive layer 31.

The insulating layer 32 is formed of an insulating material such as polyimide, acrylic resin, silicon nitride (SiN), silicon oxide (SiO) or the like.

On the insulating layer 32, a first electrode 33, an organic layer 34, and a second electrode 35 are stacked in this order from the side of the insulating layer 32. As will be described in detail later, the first electrode 33 is a layer stacked on the insulating layer 32 when the lower electrode E1 is formed, and is formed of the same material as that of the lower electrode E1. Further, the organic layer 34 is a layer stacked on the first electrode 33 when the organic layer OR is formed, and is formed of the same material as that of the organic layer OR. Furthermore, the second electrode 35 is a layer stacked on the organic layer 34 when the upper electrode E2 is formed and is formed of the same material as that of the upper electrode E2.

The first electrode 33 stacked on the insulating layer 32 is, by its respective ends, connected to the upper electrode E2A (the first upper electrode) of the display element 20A and the upper electrode E2B (the second upper electrode) of the display element 20B. That is, the upper electrode E2A of the display element 20A and the upper electrode E2B of the display element 20B are electrically connected to each other via the first electrode 33. With this configuration, it possible to make the upper electrode E2 function as a common layer commonly used over multiple subpixels or multiple display elements.

Figure 3:
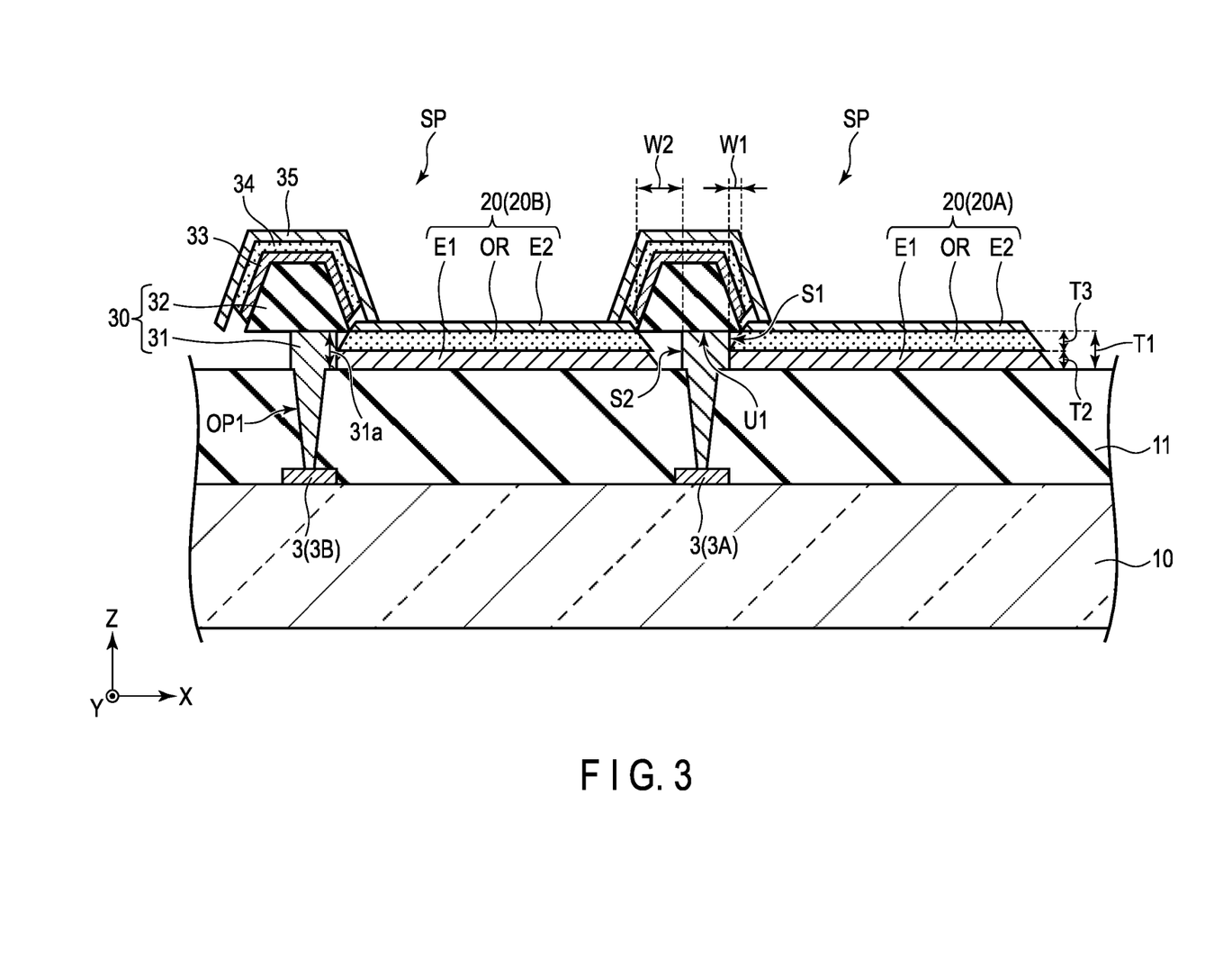
FIG. 3 is a cross-sectional view of another configuration example of subpixels shown in FIG. 1.
Figure 4:
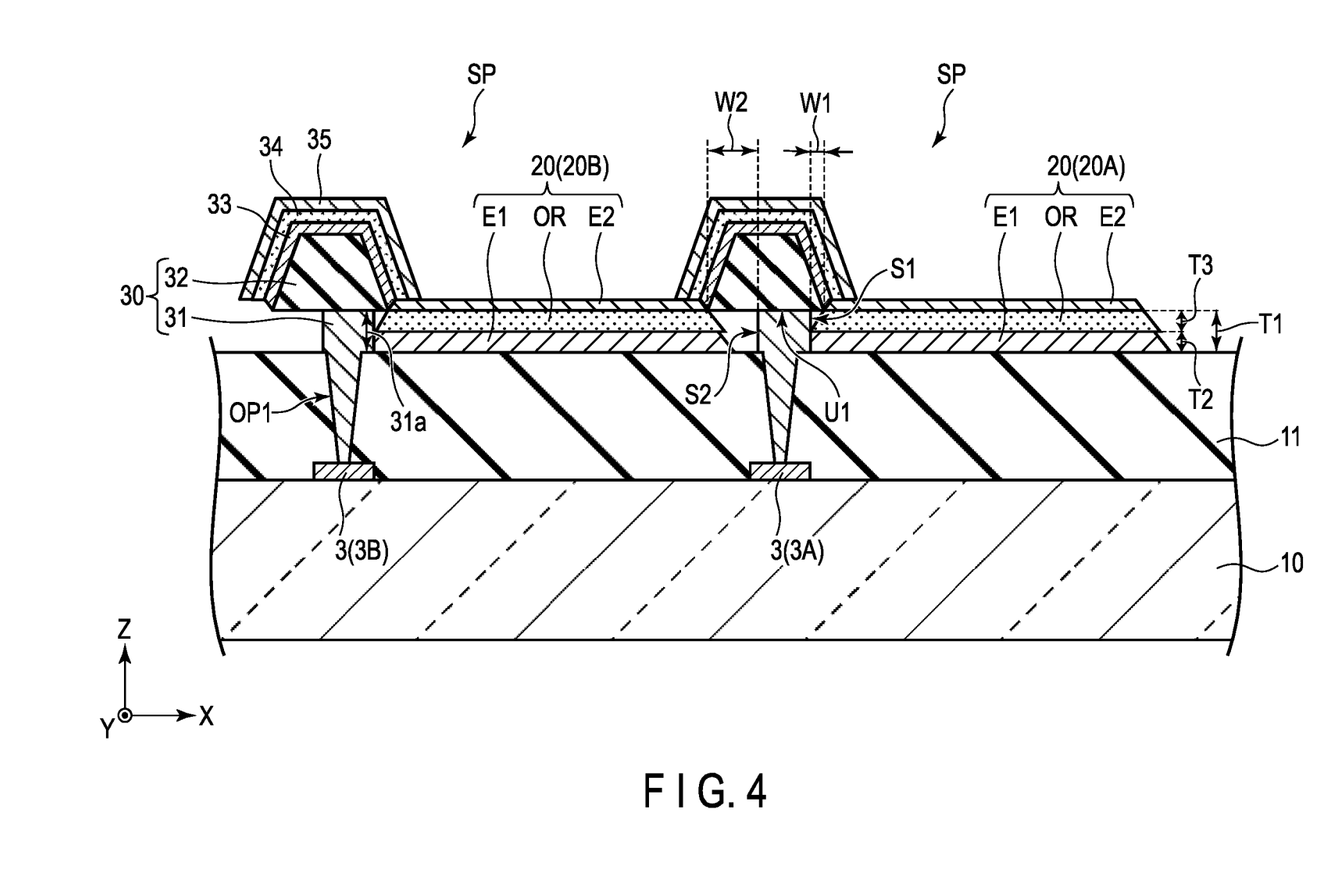
FIG. 4 is a cross-sectional view of still another configuration example of subpixels shown in FIG. 1.

Here, FIG. 2 illustrates the configuration that the upper electrode E2A of display element 20A and the upper electrode E2B of display element 20B are connected to each other via the first electrode 33 so as to form the upper electrode E2 commonly used over multiple subpixels or multiple display elements. Note that the configuration is not limited to this, but as shown in FIG. 3, such a configuration may as well do that the upper electrode E2A of the display element 20A and the upper electrode E2B of the display element 20B are connected via the second electrode 35, thereby forming the upper electrode E2B commonly used. Or, as shown in FIG. 4, such a configuration may as well do that the upper electrode E2A of the display element 20A and the upper electrode E2B of the display element 20B are connected to both the first electrode 33 and the second electrode 35, thereby forming the upper electrode E2 commonly used.

According to the configuration shown in FIG. 2 described above, the light-emitting area of the display element 20 can be formed in the region where the organic layer OR disposed between the lower electrode E1 and the upper electrode E2 is located. The organic layer 34 stacked on the insulating layer 32 is not located between the lower electrode E1 and the upper electrode E2, and therefore it does not emit light.

Further, according to the configuration shown in FIG. 2 described above, the partition wall 30 is disposed between two adjacent display elements 20. In other words, the display element 20 is disposed between the two partition walls 30. The lower electrode E1, which constitutes the display element 20, is connected to the conductive layer 31 that constitutes one of the two partition walls 30, and is electrically connected to the drive transistor 3 via the conductive layer 31. The upper electrode E2, which constitutes the display element 20, is electrically connected to the upper electrode E2 of the adjacent display element 20 via at least one of the first electrode 33 and the second electrode 35 disposed on the insulating layer 32 which constitutes the partition wall 30.

Figure 5:
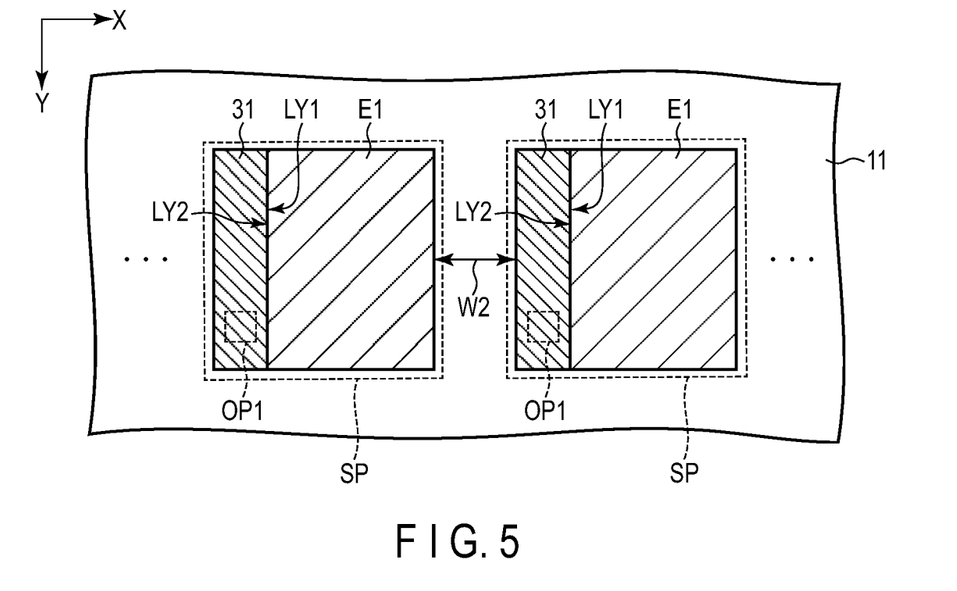
FIG. 5 is a plan view showing a configuration of a part of the subpixel.

FIG. 5 is a plan view showing the conductive layer 31 and the lower electrode E1 shown in FIG. 2. FIG. 5 illustrates the conductive layer 31 and the lower electrode E1 contained in each of the two subpixels SP adjacent to each other along the first direction X.

The conductive layer 31 is disposed along one edge LY1 of the lower electrode E1, extending along the second direction Y on the insulating layer 11 and is connected to the lower electrode E1. The conductive layer 31 should preferably be formed such that one edge LY2 extending along the second direction Y and connected to the lower electrode E1 is more than or equal to one edge LY1 of the lower electrode E1 extending along the second direction Y. FIG. 5 shows a case where the conductive layer 31 is formed such that one edge LY2 extending along the second direction Y is equal to one edge LY1 of the lower electrode E1, extending along the second direction Y.

The conductive layer 31 is connected to the pixel circuit (the drive transistor) via the opening OP1 formed in the insulating layer 11. The region that overlaps the lower electrode E1 in plan view is equivalent to the light-emitting area of the subpixel SP (or the display element 20 contained therein).

Between the lower electrode E1 contained in one subpixel SP and the conductive layer 31 in the adjacent subpixel SP, a predetermined space is provided. The predetermined space is equivalent to the portion that overlaps the second portion of the insulating layer 32 having the width W2 shown in FIG. 2 in plan view.

The conductive layer 31 disposed along the edge LY1 of the lower electrode E1, extending along the second direction Y, functions as a wall to prevent the lower electrode E1 from being connected to the lower electrode E1 contained in the adjacent subpixel SP, and further a wall to prevent the organic layers disposed on the lower electrodes E1 contained in the subpixels SP from being connected to each other.

Figure 6:
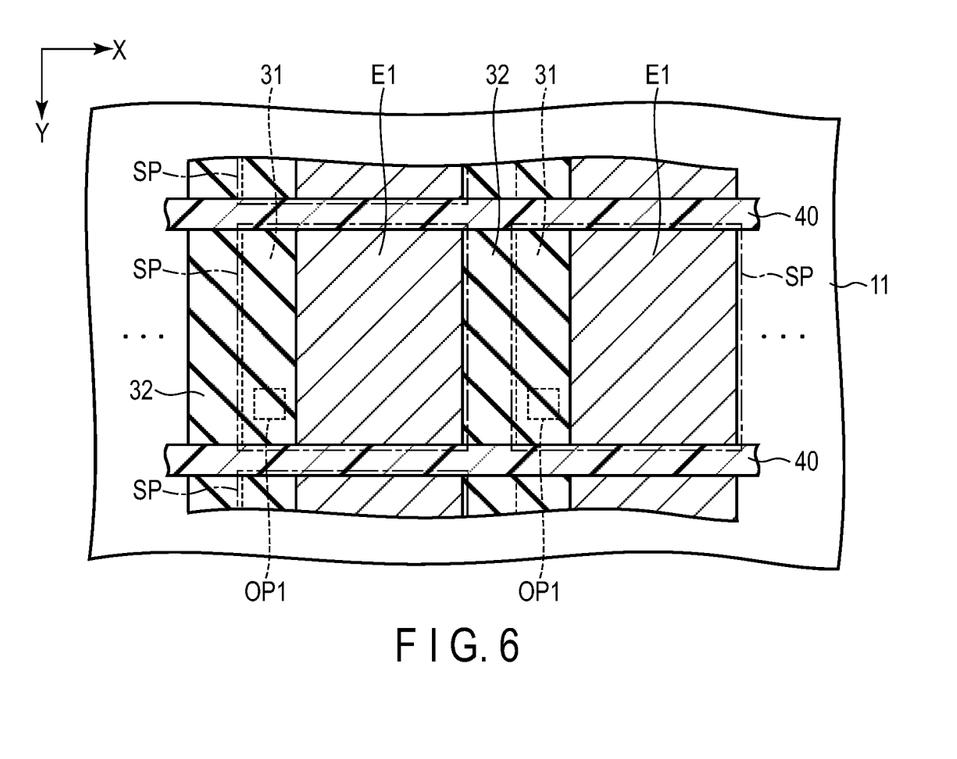
FIG. 6 is a plan view showing a configuration of a part of the subpixel.

FIG. 6 is a plan view showing the conductive layer 31, the insulating layer 32 and the lower electrode E1 shown in FIG. 2, and the insulating layer 40 disposed between adjacent subpixels SP along the second direction Y.

The insulating layer 32 is disposed on the conductive layer 31. The insulating layer 32 is disposed between the lower electrodes contained in the two subpixels SP adjacent along the first direction X. The insulating layer 32 is formed such that one edge thereof extending along the first direction X is longer than one edge of the conductive layer 31, that overlaps in plan view along the first direction X, and one edge extending along the second direction Y is equal to one edge of the conductive layer 31, that overlaps in plan view along the second direction Y.

On the insulating layer 11, an insulating layer 40 (a third insulating layer) is formed between two subpixels SP adjacent to each other along the second direction Y. The insulating layer 40 is an organic insulating layer disposed on the insulating layer 11, and is formed to have a thickness of T1 or more as described above, along the third direction Z from the surface of the insulating layer 11. Preferably, the insulating layer 40 should be formed to have a thickness approximately equal to the thickness of the partition wall 30. The insulating layer 40 functions as a wall to prevent the lower electrodes contained in the two subpixels SP adjacent to each other along the second direction Y and the organic layers from being connected to each other.

As shown in FIG. 6, the light-emitting area (the area that overlaps the lower electrode E1 in plan view) of the subpixel SP (or the display element 20 contained therein) is surrounded by the insulating layer 32 and the insulating layer 40.

Figure 7:
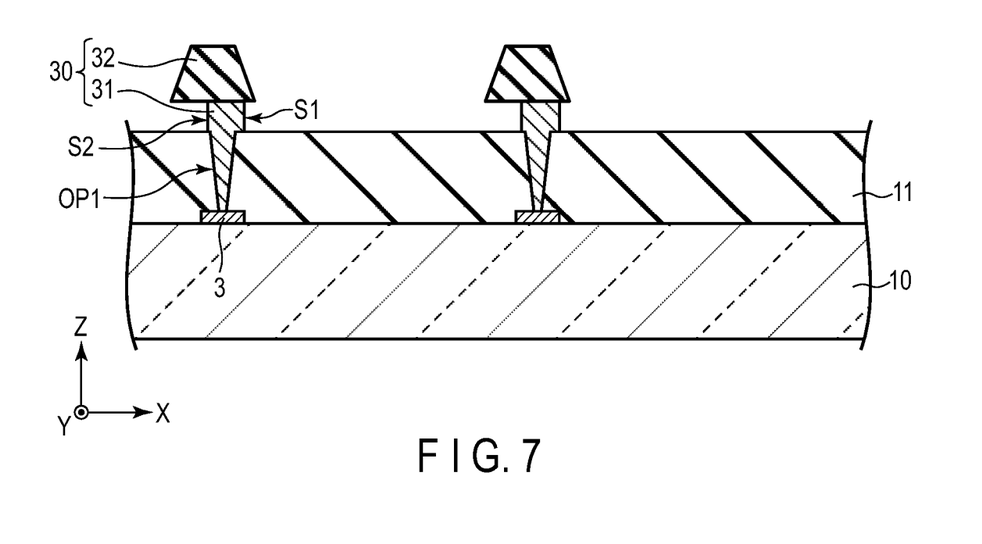
FIG. 7 is a diagram showing a processing step of forming the cross-sectional configuration shown in FIG. 2.
Figure 8:
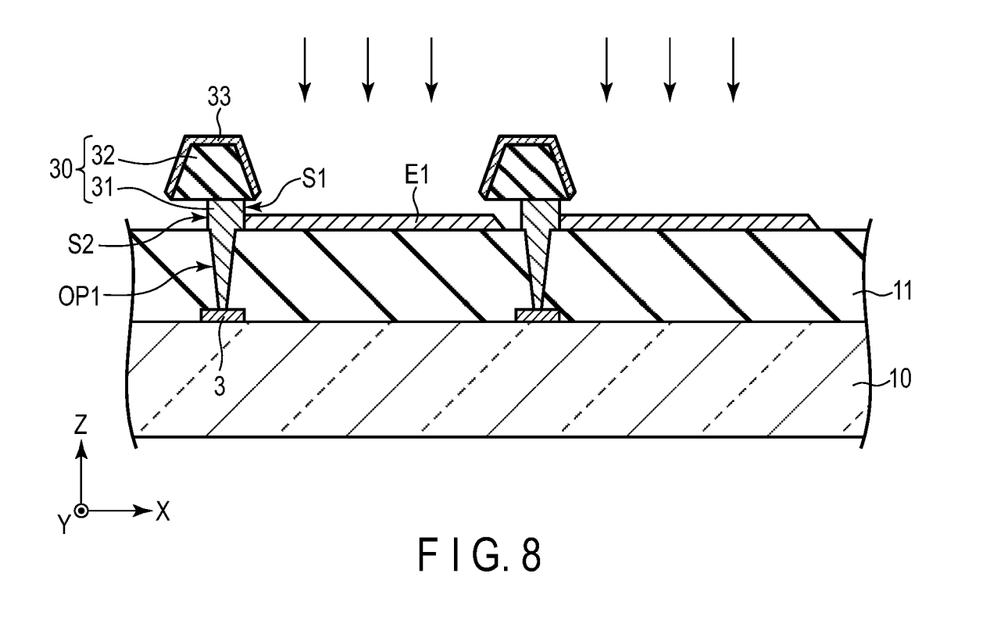
FIG. 8 is a diagram showing a processing step of forming the cross-sectional configuration shown in FIG. 2.
Figure 9:
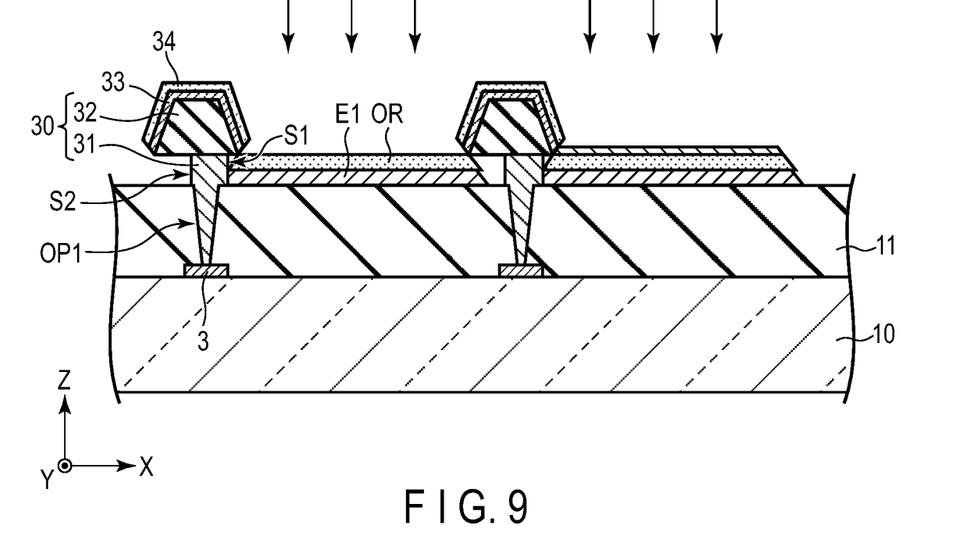
FIG. 9 is a diagram showing a processing step of forming the cross-sectional configuration shown in FIG. 2.

FIGS. 7 to 9 each illustrate a processing step of formation of the cross-sectional configuration shown in FIG. 2.

First, drive transistors 3 are disposed on the base 10. Then, the insulating layer 11 is formed to cover the base 10 and the drive transistors 3. Next, an opening OP1 is formed in each area overlapping the respective drive transistor 3.

Subsequently, a conductive layer, which is the source of the columnar conductor 31 that constitutes the partition walls 30, is formed to cover the openings OP1. Further, an insulating layer, which is the source of the insulating eaves 32 that constitute the partition wall, is formed on the conductive layer. After that, the insulating layer is patterned to form the insulating eaves 32, and the conductive layer is patterned by side etching to form the columnar conductor 31, thereby forming the partition walls 30. In forming the columnar conductor 31, the condition is set such that the etching from the second side surface S2 side is accelerated compared to the etching from the first side surface S1 side, and the partition walls 30 with the eaves 32 of an asymmetrical shape as shown in FIG. 7 is formed.

Next, the lower electrodes S1 are formed, for example, by the vapor sputtering method. Here, the material from the target is radiated isotropically, for example. The material isotropically emitted is deposited on the insulating layer 11 and the insulating eaves 32, and is partially detouring around inside the insulating eaves 32 to be deposited there. As described above, the insulating eaves have an asymmetrical shape, and therefore, as shown in FIG. 8, the lower electrode E1 is formed to connect only to the first side surface S1 of the narrow eave side. Further, on each of the insulating eaves 32, the first electrode 33 is formed.

Then, the organic layer OR is formed, for example, by the vacuum deposition method. Here, the vapor from the deposition source is radiated isotropically, for example. With this operation, the organic layer OR is formed on the lower electrodes E1 as shown in FIG. 9. Further, the organic layer 34 is formed on the respective first electrode 33.

After that, the upper electrode E2 is formed, for example, by the sputtering method. Here, the material from the target is radiated isotropically, for example. With this operation, as shown in FIG. 2, the upper electrode E2 is formed on the organic layer OR, and both ends thereof are connected to the first electrodes 33, respectively. Further, the second electrodes 35 are formed on the organic layer 34.

According to the configuration of this embodiment described above, a partition wall 30 is disposed between two adjacent display elements 20, and the organic layer OR formed without a fine mask is divided by the separation wall 30. Thus, a display element 20 with an organic layer OR of the desired shape can be provided. Therefore, as compared to the case where a fine mask is applied, the manufacturing cost can be reduced. Moreover, such processing steps including positioning of a fine mask become unnecessary, and the organic layer OR of the desired shape can be easily formed. Further, the light-emitting area can be formed in a predetermined area in the display element 20.

Further, the upper electrode E2 as well is divided by the partition wall 30 as in the case of the organic layer OR, but the divided upper electrodes E2 are electrically connected via at least one of the first electrode 33 and the second electrode 35 stacked on the respective partition wall 30. The first electrode 33 and the second electrode 35 are connected to the display area DA, or to the power supply lines of a predetermined potential on an outer side the display area DA. With this configuration, to the upper electrode E2 of each display element 20, a predetermined potential is supplied via at least one of the first electrode 33 and the second electrode 35. That is, the potential drop, which may occur in some of the upper electrodes E2, is suppressed.

Further, in each respective adjacent pair of display elements 20, undesired current leakage (crosstalk), which may be caused by the connection of the organic layers OR, is suppressed. Therefore, the desired display performance can be achieved in the display elements 20.

Note that in this embodiment, the shape of the insulating eaves 32 is made asymmetrical with respect to the columnar conductor 31, so that the lower electrode E1 is connected to only one side of the columnar conductor 31, but the configuration is not limited to this. For example, when the radiation angle of the material for forming the lower electrode E1 is made anisotropic, the lower electrode E1 can be connected to only one side of the columnar conductor 31.

Figure 10:
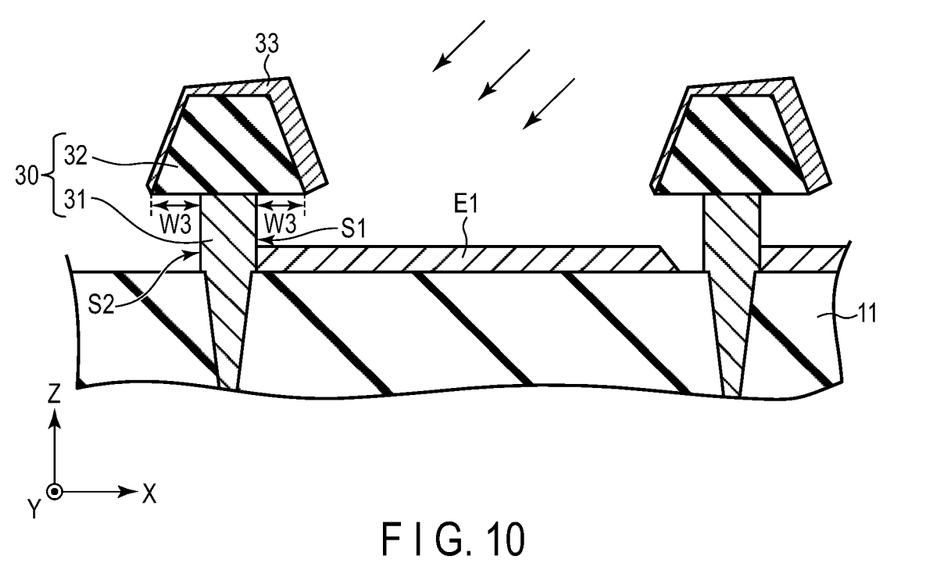
FIG. 10 is a diagram illustrating an example of method of forming a lower electrode.

In this case, as shown in FIG. 10, the insulating eaves 32 need not have an asymmetrical shape. FIG. 10 shows the case where the width protruding from the first side surface S1 and the width protruding from the second side surface S2 are both W3, and the insulating eaves 32 have a symmetrical shape.

As shown in FIG. 10, in order to connect the lower electrode E1 to only the first side surface S1 of the columnar conductor 31, the material from the target is radiated with a predetermined radiation angle from the right side of the figure towards the left side of the figure. With this operation, the lower electrode E1 can be formed to connect to the first side surface S1 of one columnar conductor 31, and separated from the second side surface S2 of the adjacent columnar conductor 31. As described above, the material from the target is radiated with a predetermined radiation angle from the right side of the figure towards the left side of the figure, the first electrode 33 stacked on the insulating layer 32 is thicker on the right side of the figure and thinner on the left side of the figure.

According to one embodiment described above, it is possible to provide a display device which can suppress the degradation in performance of the display element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a base;
   a pixel circuit disposed on the base;
   a first insulating layer which covers the base and the pixel circuit;
   a first lower electrode and a second lower electrode disposed on the first insulating layer;
   a partition wall disposed between the first lower electrode and the second lower electrode on the first insulating layer and connected to the pixel circuit via an opening formed in the first insulating layer;
   a first organic layer disposed on the first lower electrode; and
   a first upper electrode disposed on the first organic layer, wherein
   the partition wall includes:
     a conductive layer disposed on the first insulating layer and connected to the pixel circuit via the opening, and including a first side surface opposing the first lower electrode and a second side surface opposing the second lower electrode; and
     a second insulating layer disposed on the conductive layer,
   the first lower electrode is in contact with the first side surface and the second lower electrode being spaced apart from the second side surface,
   the second insulating layer includes a first portion protruding from the first side surface toward the first lower electrode and a second portion protruding from the second side surface toward the second lower electrode, and
   a width of the first portion is smaller than a width of the second portion.

2. The display device of claim 1, wherein
a distance between the second lower electrode and the second side surface is substantially equal to a width of the second portion.

3. The display device of claim 1, wherein
a thickness of the conductive layer taken from an upper surface of the first insulating layer is less than or equal to a total of a thickness of the first lower electrode and a thickness of the first organic layer.

4. The display device of claim 1, further comprising:
a second organic layer disposed on the second lower electrode;
a second upper electrode disposed on the second organic layer; and
a first electrode disposed on the partition wall and formed of a material identical to that of the first lower electrode and the second lower electrode,
wherein
the first upper electrode and the second upper electrode are connected to each other via the first electrode.

5. The display device of claim 4, further comprising:
a second electrode disposed on the first electrode and formed of a material identical to that of the first upper electrode and the second upper electrode,
wherein
the first upper electrode and the second upper electrode are connected to each other via the first electrode and the second electrode.

6. The display device of claim 4, wherein
the partition wall divides the first lower electrode and the first organic layer, from the second lower electrode and the second organic layer.

7. The display device of claim 1, wherein
the conductive layer is disposed, in plan view, along one edge of the first lower electrode and spaced apart from one edge of the second lower electrode.

8. The display device of claim 7, further comprising: a third insulating layer disposed along another side of the first lower electrode, extending in a direction intersecting the edge of the first lower electrode in plan view.

9. The display device of claim 8, wherein
a thickness of the third insulating layer is greater than a total of a thickness of the first lower electrode and a thickness of the first organic layer.

10. The display device of claim 9, wherein
the thickness of the third insulating layer is substantially equivalent to a thickness of the partition wall.

11. A display device comprising:
a base;
a pixel circuit disposed on the base;
a first insulating layer which covers the base and the pixel circuit;
a first lower electrode and a second lower electrode disposed on the first insulating layer;
a partition wall disposed between the first lower electrode and the second lower electrode on the first insulating layer and connected to the pixel circuit via an opening formed in the first insulating layer;
a first organic layer disposed on the first lower electrode; and
a first upper electrode disposed on the first organic layer, wherein
the partition wall includes:
    a conductive layer disposed on the first insulating layer and connected to the pixel circuit via the opening, and including a first side surface opposing the first lower electrode and a second side surface opposing the second lower electrode; and
    a second insulating layer disposed on the conductive layer,
the first lower electrode is in contact with the first side surface and the second lower electrode being spaced apart from the second side surface,
the second insulating layer includes a first portion protruding from the first side surface toward the first lower electrode and a second portion protruding from the second side surface toward the second lower electrode, and
a width of the first portion is equal to a width of the second portion.

12. The display device of claim 11, wherein
a thickness of the conductive layer taken from an upper surface of the first insulating layer is less than or equal to a total of a thickness of the first lower electrode and a thickness of the first organic layer.

13. The display device of claim 11, further comprising:
a second organic layer disposed on the second lower electrode;
a second upper electrode disposed on the second organic layer; and
a first electrode disposed on the partition wall and formed of a material identical to that of the first lower electrode and the second lower electrode,
wherein
the first upper electrode and the second upper electrode are connected to each other via the first electrode.

14. The display device of claim 13, further comprising:
a second electrode disposed on the first electrode and formed of a material identical to that of the first upper electrode and the second upper electrode,
wherein
the first upper electrode and the second upper electrode are connected to each other via the first electrode and the second electrode.

15. The display device of claim 13, wherein
the partition wall divides the first lower electrode and the first organic layer, from the second lower electrode and the second organic layer.

16. The display device of claim 11, wherein
the conductive layer is disposed, in plan view, along one edge of the first lower electrode and spaced apart from one edge of the second lower electrode.

17. The display device of claim 16, further comprising:
a third insulating layer disposed along another side of the first lower electrode, extending in a direction intersecting the edge of the first lower electrode in plan view.

18. The display device of claim 17, wherein
a thickness of the third insulating layer is greater than a total of a thickness of the first lower electrode and a thickness of the first organic layer.

19. The display device of claim 18, wherein
the thickness of the third insulating layer is substantially equivalent to a thickness of the partition wall.

* * * * *